(12) United States Patent
Fu et al.

(10) Patent No.: US 7,750,739 B2
(45) Date of Patent: Jul. 6, 2010

(54) DUAL REACTIVE SHUNT LOW NOISE AMPLIFIER

(75) Inventors: Chang-Tsung Fu, Donggang Town (TW); Stewart S. Taylor, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 18 days.

(21) Appl. No.: 11/879,921

(22) Filed: Jul. 19, 2007

(65) Prior Publication Data
US 2009/0021295 A1    Jan. 22, 2009

(51) Int. Cl.
*H03F 3/191* (2006.01)
(52) U.S. Cl. .................. 330/292; 330/294; 330/305
(58) Field of Classification Search ............. 330/103, 330/292, 305, 306
See application file for complete search history.

(56) References Cited

U.S. PATENT DOCUMENTS

| | | | | | |
|---|---|---|---|---|---|
| 4,685,041 | A | * | 8/1987 | Bowman et al. | 363/40 |
| 5,164,682 | A | * | 11/1992 | Taralp | 330/292 |
| 5,491,450 | A | * | 2/1996 | Helms et al. | 330/277 |
| 6,211,738 | B1 | * | 4/2001 | Hecht | 330/292 |
| 6,903,612 | B2 | * | 6/2005 | Toncich et al. | 330/302 |
| 7,339,436 | B2 | * | 3/2008 | Fu et al. | 330/294 |

OTHER PUBLICATIONS

Fu et al., "A 2.4 to 5.4 GHz Low Power CMOS Reconfigurable LNA for Multistandard Wireless Receiver", 2007 IEEE Radio Frequency Integrated Circuits Symposium, pp. 65-68.

* cited by examiner

*Primary Examiner*—Steven J Mottola
(74) *Attorney, Agent, or Firm*—Trop, Pruner & Hu, P.C.

(57) ABSTRACT

A dual reactive shunt feedback low noise amplifier design may include a transconductance amplifier having a capacitor coupled across it and a pair of coupled inductors coupled across it. In one embodiment, the coupled inductors may be laid out as two overlapping coils.

16 Claims, 2 Drawing Sheets

DUAL REACTIVE SHUNT LOW NOISE AMPLIFIER

BACKGROUND

This relates generally to a low noise amplifier for a radio frequency system.

In a radio frequency receiver or transceiver, the low noise amplifier initially amplifies the signal received from the antenna.

In order to reduce the cost of low noise amplifiers, it is desirable to reduce their die area and their pin count.

Given the proliferation of wireless technologies and associated standards, it would be desirable to have a single radio system that supports multiple bands and multiple standards, lowering the hardware cost and enabling wireless access anywhere and any time.

In any such multi-standard radio frequency system, one of the most critical issues is the large dynamic range to cover various needs of different standards. Consequently, front end low noise amplifier design is a great challenge because of its noise figure and linearity requirement. While a broadband low noise amplifier faces problems, including wide noise bandwidth and stringent linearity, a frequency-tuned low noise amplifier with preliminary band selection is highly desirable.

DETAILED DESCRIPTION

In accordance with some embodiments of the present invention, a dual reactive feedback low noise amplifier simultaneously meets desired electrical performance while reducing die area. Embodiments of the low noise amplifier may be well suited to complementary metal oxide semiconductor (CMOS) technologies but may also be implemented in any other technologies.

In some embodiments, the amplifier may achieve excellent noise figure and selectivity, while occupying a smaller die area than conventional reconfigurable low noise amplifier designs. The shunt/inductor input configuration may provide increased blocker suppression and improved electrostatic discharge protection in some embodiments.

Figure 1:
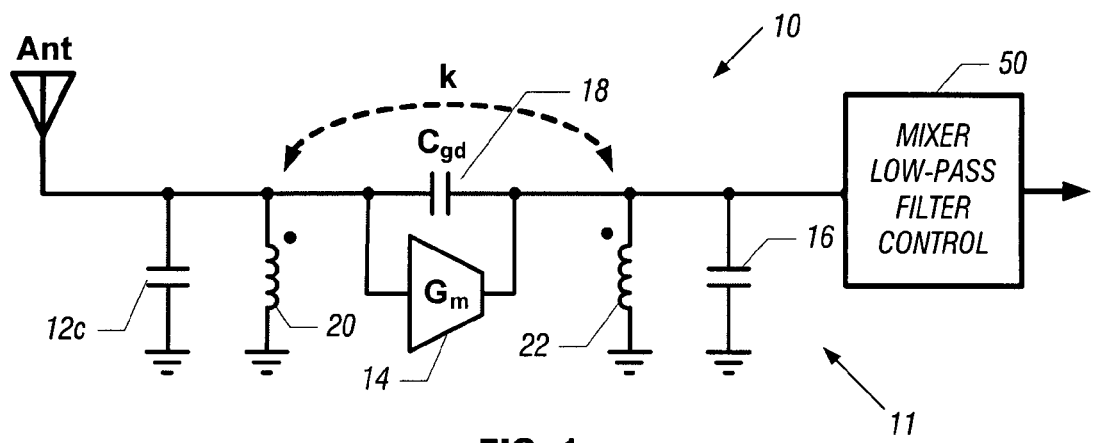
FIG. 1 is a functional circuit diagram of one embodiment of the present invention.

Referring to FIG. 1, a reconfigurable receiver front end architecture 11 includes a low noise amplifier 10 coupled to an antenna ANT on one side and coupled on the other side to a unit 50 which may include a band-selective amplifier, a broadband mixer, a variable bandwidth low-pass filter, and a digital control. The unit 50 is coupled to the broadband signal process. The low noise amplifier, a local oscillator, and the low-pass filter are controlled digitally for different specifications by a digital control that may refer to a parameter look up table. The receiver 11 allows the signal of interest to pass through the receiving path, while other signals turn into spurious noise and are excluded. The low noise amplifier is reconfigurable to meet the required circuit performance at the tuned operating frequency over a specified frequency range such as 3 gigahertz.

The dual reactive shunt feedback low noise amplifier 10 includes a transconductance amplifier 14, an input capacitance 12, an output capacitance 16, a capacitor 18 connected between the input and output nodes, and two mutual coupled shunt inductors 20 and 22 with a coupling coefficient k. The transconductance amplifier provides an output current proportional to its input voltage. It can be represented as a voltage controlled current source.

The mutual coupling of the inductors 20 and 22 and the capacitive coupling by the capacitor 18 and the capacitor 16 constitute inductive and capacitive shunt feedback, respectively. These two feedback paths work together to set the real part of the input impedance over a broad frequency range.

The dual reactive shunt feedback amplifier may provide good impedance matching, low noise figure and high voltage gain with a narrow band response, in some embodiments. A narrow band response may provide significant selectivity, filtering out-of-band interference that alleviates the filtering and linearity requirements of other stages in some embodiments.

Figure 2:
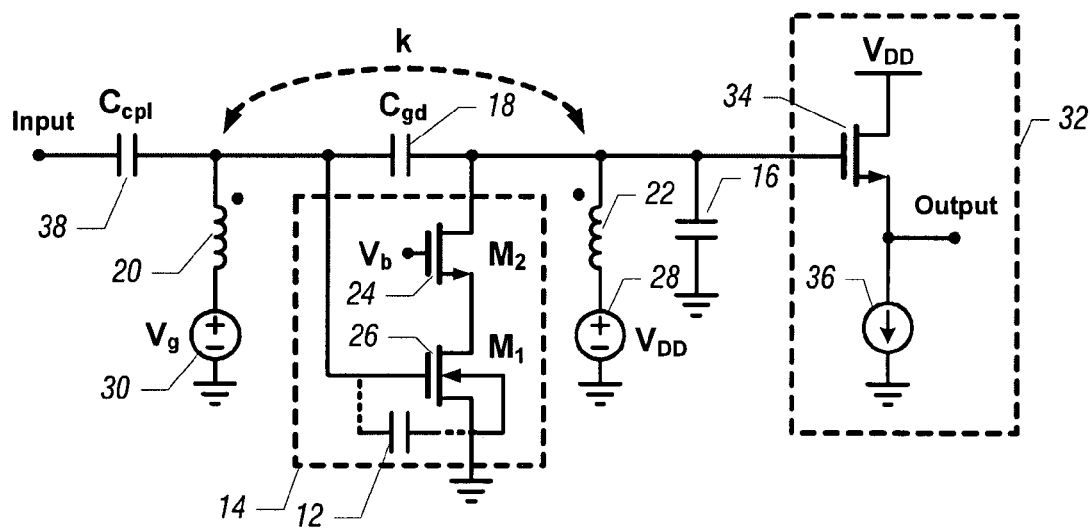
FIG. 2 is a simplified circuit diagram for one embodiment of the present invention.

Referring to FIG. 2, a more detailed circuit implementation of the dual reactive shunt feedback low noise amplifier 10 of FIG. 1, in accordance with one embodiment, is depicted. The transconductance amplifier 14, illustrated in FIG. 1 as well, is implemented, in one embodiment, by a cascode amplifier including field effect transistors 24 and 26. The capacitor 12, from FIG. 1, may be implemented by the gate-to-source parasitic capacitance of the transistor 26.

A source follower is used as the output voltage buffer 32. The buffer 32 includes a current source 36 and a transistor 34 whose drain is coupled to a supply voltage and whose source is coupled to ground through an output and the source 36. The design of this output voltage buffer 32 may be different for different systems.

In one embodiment, the input coupling capacitor 38 is included as part of the input matching network. Two different bias potentials 30 and 28 are provided for the inductors 20 and 22.

Figure 3:
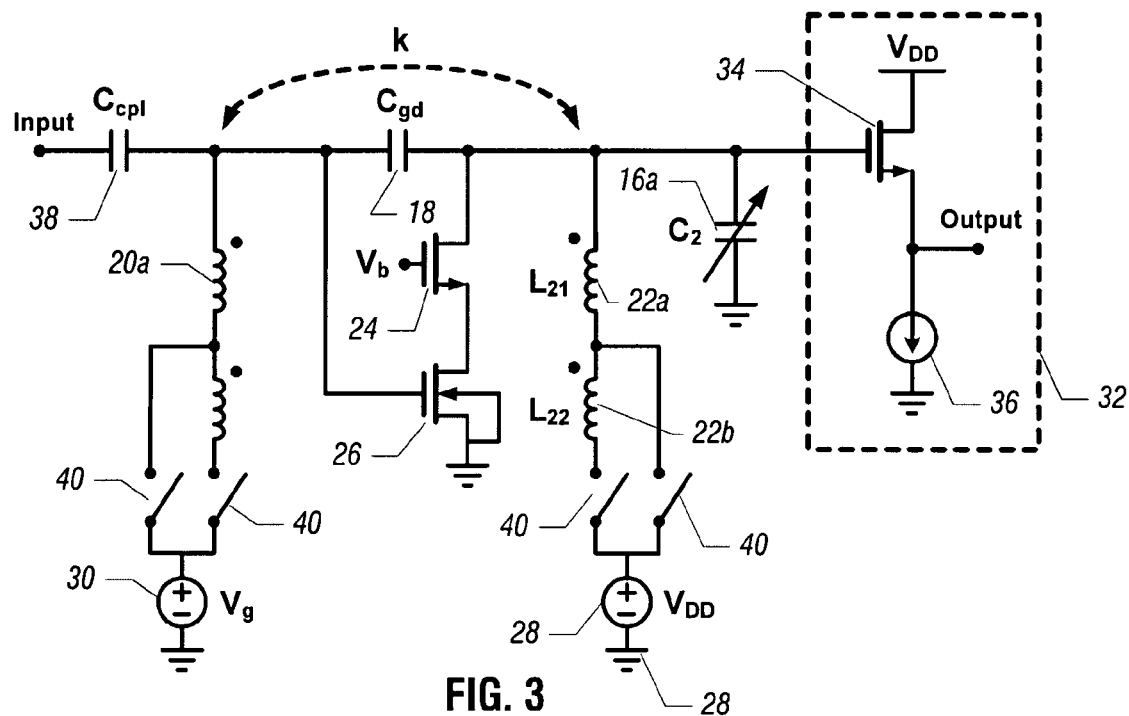
FIG. 3 is a simplified circuit diagram for another embodiment of the present invention.

FIG. 3 shows an embodiment of FIG. 2 where the low noise amplifier is reconfigured for multiple bands. The inductors 20a and 22a are tapped and changed with switches 40 to change gross tuning for the desired bands. The switches 40 may be implemented with MOSFETs (not shown) in one embodiment. Fine tuning may be provided within a band with a varactor 16a. This fine tuning could also be accommodated with small capacitors and switches as part of the capacitor 16 in other embodiments.

The output voltage buffer 32 includes a current source 16, an output node, and a MOSFET transistor 34. The other elements are as described already.

Figure 4:
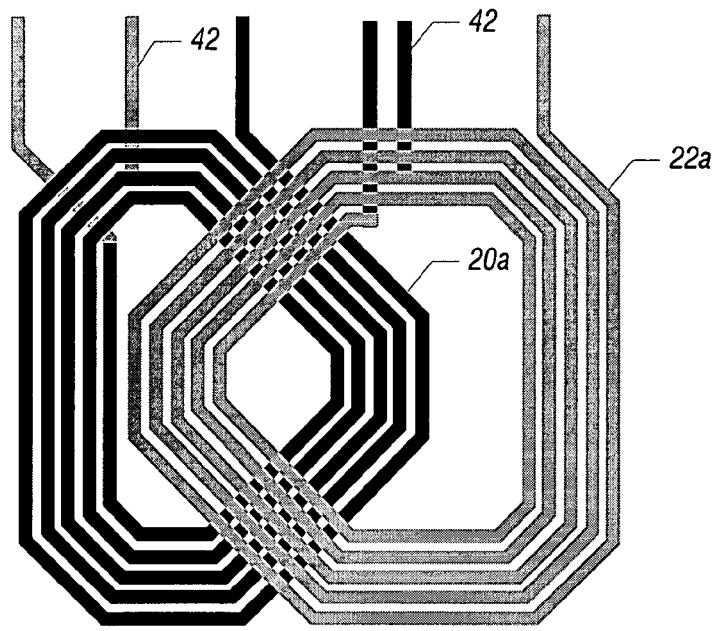
FIG. 4 is a top plan view of overlapped, coupled inductors useful in the embodiments of FIGS. 1-3.

FIG. 4 shows the layout of the coupled inductors 20a and 22a of FIG. 3 in accordance with one embodiment. The tapped transformer may include two small, partially overlapped planar coils 20a and 22a, representing the inductors 20a and 22a. Each coil 20a or 22a has a tap 42 at the middle. The partial overlap of the coils provides the desired coupling coefficient k, while also reducing the die area, compared to a conventionally tuned low noise amplifier with separate input and output inductors. The coupling coefficient k may be less than 0.3 in some embodiments. For example, the coupling coefficient k can be about 0.2, as one example.

In some embodiments, the low noise amplifier described herein may be used for multi-com radios that require multiple low noise amplifiers that utilize a large die area currently and require many packaged pins. Alternative reconfigurable low noise amplifiers may use more die area and have worse performance in terms of noise figure and gain than the embodiments depicted herein. Broadband low noise amplifiers typically have worse linearity and require other receiver components to have greater linearity.

In some embodiments, the need for a separate grounded high pass shunt coupled inductor to filter low frequency blockers can be eliminated. The input side shunt inductor may act to shield against a blocker while also providing inductive shunt feedback. The use of an additional input shunt inductor to prevent blockers would take up more die area, increasing costs. The input shunt inductor 20 blocks low frequency signals (blockers) from interfering with the receiver. A blocker could overload an amplifier designed to operate at high frequencies, absent a high pass shunt coupled inductor.

As a result, die area is conserved, in some embodiments, by the use of one inductor to filter blockers and provide reactive feedback. This is a result of providing feedback using a shunt inductor that also can combat overloading by blockers.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A low noise amplifier comprising:
    a transconductance amplifier comprising a parasitic capacitor;
    input and output shunt inductors coupled across said transconductance amplifier, said input and output shunt inductors being mutually coupled to one another; and
    a non-parasitic capacitor coupled to said transconductance amplifier,
    wherein the input and output shunt inductors and the parasitic and non-parasitic capacitors establish capacitive and inductive feedback paths.

2. The low noise amplifier of claim 1 wherein said input shunt inductor acts to control blockers.

3. The low noise amplifier of claim 1 wherein the transconductance amplifier comprises a transistor and the parasitic capacitor comprises a parasitic capacitor of the transistor.

4. The low noise amplifier of claim 1 wherein said inductors are partially overlapping.

5. The low noise amplifier of claim 4 wherein said inductors have a coupling coefficient of less than 0.3.

6. The low noise amplifier of claim 4 wherein said inductors are a tapped transformer.

7. The low noise amplifier of claim 1 wherein said low noise amplifier is a multi-band low noise amplifier including switches for gross tuning and a varactor for fine tuning.

8. A method comprising:
    forming a receiver with a low noise amplifier, the low noise amplifier comprising a parasitic capacitor;
    coupling input and output shunt inductors across the amplifier;
    coupling a non-parasitic capacitor to the amplifier; and
    using the input and output shunt inductors and the parasitic and non-parasitic capacitors to create inductive and capacitive feedback paths.

9. The method of claim 8 including providing a transconductance amplifier and input and output shunt inductors coupled across said transconductance amplifier.

10. The method of claim 9 including partially overlapping said inductors.

11. The method of claim 10 including overlapping said inductors to have a coupling coefficient of less than 3.

12. The method of claim 10 including using a tapped transformer to form said inductors.

13. The method of claim 8 including providing a multi-band low noise amplifier.

14. The method of claim 8 including mutually coupling said inductors to one another, one of said inductors connected to an output of said low noise amplifier.

15. A low noise amplifier comprising:
    a transconductance amplifier;
    input and output shunt inductors coupled across said transconductance amplifier, said input and output shunt inductors being mutually coupled to one another; and
    a parasitic capacitor and a non-parasitic capacitor coupled across said transconductance amplifier,
    wherein the input and output shunt inductors and the parasitic and non-parasitic capacitors establish capacitive and inductive feedback paths.

16. A method comprising:
    forming a receiver with a low noise amplifier;
    coupling input and output shunt inductors across the amplifier;
    coupling at least one capacitor across the amplifier; and
    using the input and output shunt inductors and said at least one capacitor to create inductive and capacitive feedback paths, comprising using a parasitic capacitor of the amplifier and at least one other non-parasitic capacitor.

* * * * *